United States Patent
Bartkowiak et al.

(10) Patent No.: US 9,999,101 B2
(45) Date of Patent: Jun. 12, 2018

(54) METHOD AND DEVICE FOR AUTOMATICALLY DETECTING THE INTACTNESS OF GROUND ELECTRODES IN THE BATH OF AN INDUCTION FURNACE AND INDUCTION FURNACE

(71) Applicants: Matthias Bartkowiak, Dortmund (DE); Christoph Forsthoevel, Dortmund (DE); Daniel Green, Clark, NJ (US)

(72) Inventors: Matthias Bartkowiak, Dortmund (DE); Christoph Forsthoevel, Dortmund (DE); Daniel Green, Clark, NJ (US)

(73) Assignee: ABP INDUCTION SYSTEMS GMBH, Dortmund (DE)

( * ) Notice: Subject to any disclaimer, the term of this patent is extended or adjusted under 35 U.S.C. 154(b) by 242 days.

(21) Appl. No.: 14/440,571

(22) PCT Filed: Nov. 7, 2013

(86) PCT No.: PCT/DE2013/000663
§ 371 (c)(1),
(2) Date: May 4, 2015

(87) PCT Pub. No.: WO2014/071914
PCT Pub. Date: May 15, 2014

(65) Prior Publication Data
US 2015/0289322 A1    Oct. 8, 2015

(30) Foreign Application Priority Data

Nov. 9, 2012 (DE) .......................... 10 2012 021 904
Feb. 19, 2013 (DE) .......................... 10 2013 002 797

(51) Int. Cl.
H05B 6/06    (2006.01)
H05B 6/28    (2006.01)
(Continued)

(52) U.S. Cl.
CPC ............. *H05B 6/28* (2013.01); *G01R 31/025* (2013.01); *H05B 6/067* (2013.01); *F27D 2021/0057* (2013.01)

(58) Field of Classification Search
CPC . H05B 6/067; H05B 6/22; H05B 6/24; H05B 6/28; F27B 14/061; F27B 14/10;
(Continued)

(56) References Cited

U.S. PATENT DOCUMENTS 4,293,730 A    10/1981   Myers
4,525,665 A    6/1985    Smalley
(Continued)

FOREIGN PATENT DOCUMENTS

EP    1818638 A    8/2007
GB    2205011 A    11/1988

*Primary Examiner* — Hung D Nguyen
(74) *Attorney, Agent, or Firm* — Andrew Wilford

(57) ABSTRACT

A method and an apparatus for automatically detecting the intactness of ground electrodes in the bath of an induction furnace are described. According to the method a low DC or AC current is applied to an additional insulated electrode extending through the furnace bottom and being in connection with the melt. After melting of the charge this current is measured and compared with a reference value. If the magnitude of the current drops below the reference value an alarm signal is generated. Furthermore, methods and devices for localizing a ground fault are described. By this, the security of the operation of an induction furnace is improved.

9 Claims, 2 Drawing Sheets

(51) Int. Cl.
*G01R 31/02* (2006.01)
*F27D 21/00* (2006.01)

(58) Field of Classification Search
CPC .......... F27B 14/14; F27B 14/20; F27D 19/00;
F27D 2021/0057; G01R 31/025
USPC ... 373/60, 70, 102, 104, 107, 108, 138, 144,
373/145, 147, 148, 149, 150, 151, 152,
373/153, 155, 156
See application file for complete search history.

(56) References Cited

U.S. PATENT DOCUMENTS

| | | |
|---|---|---|
| 5,606,480 A | 2/1997 | Nevo |
| 2008/0106830 A1* | 5/2008 | Richardson ............... F27B 3/20 361/42 |

* cited by examiner

METHOD AND DEVICE FOR AUTOMATICALLY DETECTING THE INTACTNESS OF GROUND ELECTRODES IN THE BATH OF AN INDUCTION FURNACE AND INDUCTION FURNACE

CROSS REFERENCE TO RELATED APPLICATIONS

This application is the US-national stage of PCT application PCT/DE2013/000663 filed 7 Nov. 2013 and claiming the priority of German patent application 102012021904.0 itself filed 9 Nov. 2012 and German patent application 102013002797.7 itself filed 19 Feb. 2013.

FIELD OF THE INVENTION

The present invention is directed to a method for automatically detecting the intactness of ground electrodes in the bath of an induction furnace that has an induction furnace jacket with a refractory lining and an induction coil surrounding the same as well as a ground-fault detector with at least one bath ground electrode in the lower part of the refractory lining that extends through the furnace bottom and is in connection with the bath melt.

BACKGROUND OF THE INVENTION

With "detecting the intactness of bath ground electrodes" it is also meant the detection of the intactness of the electrically conductive connection between the bath ground electrodes and the bath of the induction furnace.

A typical induction furnace contains one or more electrodes in the lower refractory lining of the furnace in order to assure that the metal melt in the interior of the bath is grounded. The intactness of these electrodes is decisive for the safe operation of an induction furnace since they provide an electrical connection between the melt bath and ground. This is a necessary presupposition for the effective operation of the ground fault monitoring in an induction furnace. If the refractory lining of the induction furnace is penetrated by the metallic melt and if the metallic melt in the crucible gets in contact with the induction furnace coil the coil is connected to the melt bath and finally to the grounded frame of the furnace through the bath ground electrodes in the bottom of the bath. In this manner a ground fault can be detected and then the power supply is switched off and an alarm is signaled to the operator of the furnace.

OBJECT OF THE INVENTION

It is the object of the present invention to provide a method of the above-cited kind with which the operational safety of an induction furnace can be improved.

SUMMARY OF THE INVENTION

This object is achieved by a method of the cited kind that has the following steps:

A low DC or AC current is applied to an additional insulated electrode extending through the furnace bottom and in connection with the melt, the current flowing from this electrode through the melt bath to the at least one bath ground electrode to ground, after melting of the charge this current is measured and is compared with a reference value and an alarm signal indicating a defect of the bath ground electrode is generated when the magnitude of the current drops below the reference value.

The present invention provides at least one insulated bath ground electrode, the ground connection of which is preferably adapted to be switched off, and at least one additional insulated electrode that also extends through the furnace bottom and is in connection with the melt. A low DC or AC current is applied to this electrode and flows therefrom through the melt bath to the remaining electrodes to ground. When the charge is molten, the magnitude of this current is measured, especially continuously, and compared with a reference value in order to ensure that the current remains above a preset minimum value. If the magnitude of this current drops below the reference value an alarm signal is generated in order to signal a warning to the operator of the furnace that the ground of the furnace melt bath is defective. Preferably, the power supply to the furnace is switched off.

In this manner the inventive method ensures that the ground-fault detector of the induction furnace has the ability to provide a ground fault alarm in the case of penetration of the metal melt through the refractory lining of the induction furnace.

According to a further development of the inventive method it is ascertained with the ground-fault detector whether the ground fault is caused by failure of the refractory lining or by other reasons. Especially, it is ascertained with the ground-fault detector upon the occurrence of a ground fault whether the ground fault exists externally of the induction coil or is caused by penetration of the metal melt through the refractory lining to the induction coil. The ground fault is localized in this case by isolating the at least one bath ground electrode from ground.

According to a further development with a ground fault by other reasons it is determined whether the ground fault is caused by a defective magnetic yoke insulation. When doing this it can be especially ascertained which magnetic yoke of the induction furnace has caused a ground fault. Successively, all the magnetic yokes are isolated from ground for determining a magnetic yoke ground fault.

Accordingly, with the inventive method an improved operational safety is achieved since it is assured that a failure of the bath ground electrodes does not remain not recognized by the operator. Furthermore, it is saved much time since the source of the ground fault is automatically localized with the method. An additional gain of security consists in the fact that, in the case of a ground fault, the operator has not to check critical zones in the range of the furnace for the search of defects. Moreover, the safety risk is eliminated that is associated with the need for a ground fault alarm bypass switch typical of prior art systems because the cause and nature of the ground fault are clearly indicated.

Furthermore, the invention is directed to an apparatus for carrying out the above-cited method that is characterized in that it contains an additional insulated electrode extending through the furnace bottom, a low-voltage source for applying a low DC or AC current to the additional electrode, means for measuring this current, means for comparing the magnitude of this current with a reference value and means for generating an alarm signal if the current drops below this reference value.

For the localization of the source of the ground fault preferably, the apparatus includes a switching device, especially a relay, for isolating the at least one bath ground electrode from ground.

The switching device is provided to automatically determine whether the ground fault exists externally of the furnace coil or is caused by penetration of the metal melt through the refractory lining. Additional yoke isolation switching devices automatically isolate the magnetic yokes one after the other in order to ascertain which yoke has caused the external ground fault.

Furthermore, the present invention is directed to an induction furnace comprising:

an induction furnace jacket with a refractory lining that is designed for the reception of a bath melt, an induction coil surrounding and supporting the refractory lining and formed for inductively heating the bath melt when a current is applied, a ground-fault detector for detecting a ground fault in the induction furnace including at least one bath ground electrode in the lower part of the refractory lining that extends through the furnace bottom and is in connection with the bath melt.

Furthermore, the induction furnace includes an apparatus for automatically determining the intactness of at least one bath ground electrode, the apparatus comprising an additional insulated electrode extending through the furnace bottom, a low-voltage source for applying a low DC or AC current to the additional insulated electrode that flows from the additional insulated electrode through the melt bath to the at least one ground electrode to ground, a comparator for measuring the current and for comparing the magnitude of the current with a reference value and means for generating an alarm signal when the current drops below the reference value.

BRIEF DESCRIPTION OF THE DRAWING

In the following the invention is described by means of an example in connection with the drawing in detail. Of the drawing

SPECIFIC DESCRIPTION OF THE INVENTION

Figure 1:
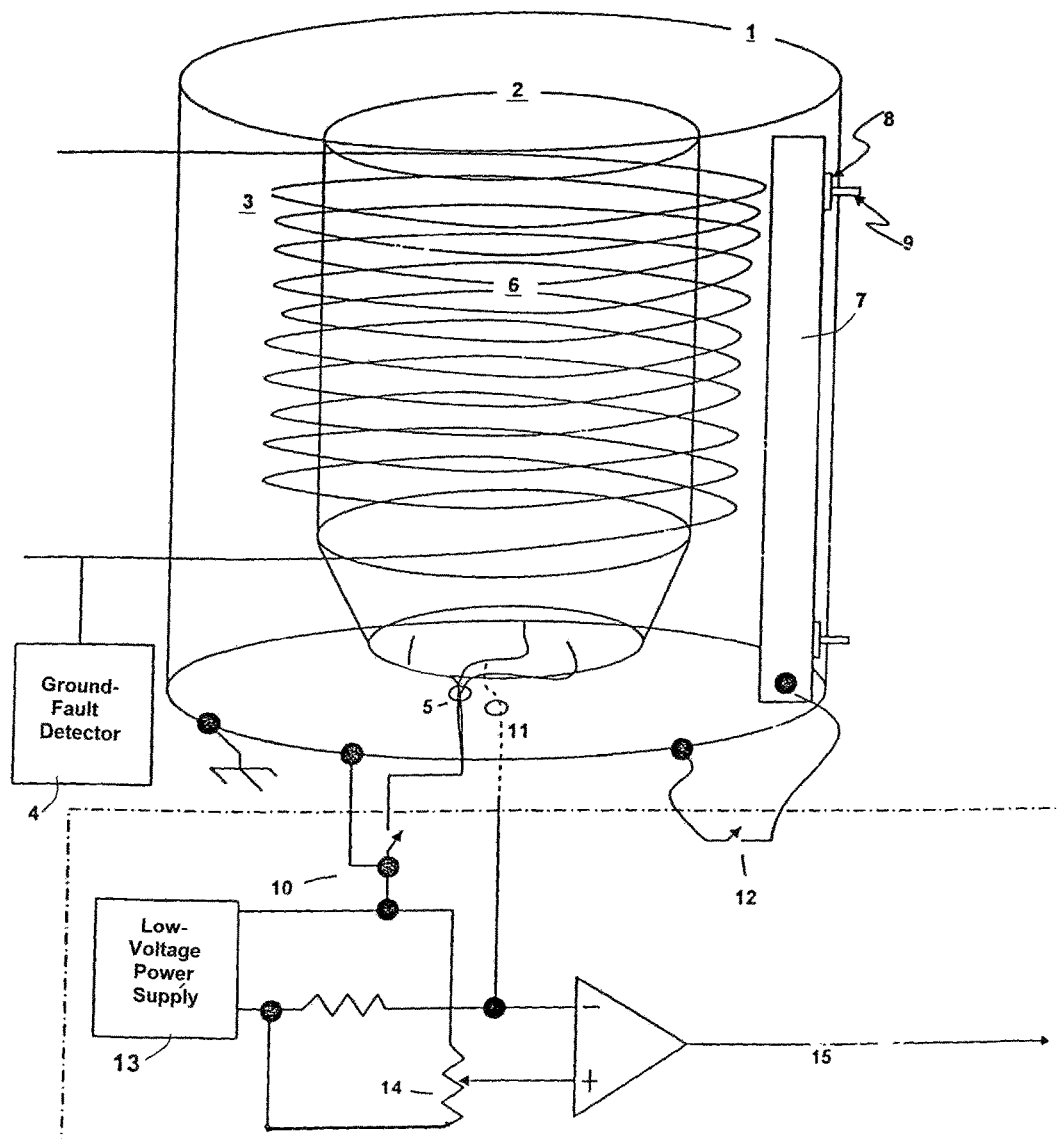
FIG. 1 shows a schematic representation of an induction furnace provided with a ground-fault detector as well as an apparatus for automatically detecting the intactness of bath ground electrodes.

The induction furnace schematically shown in FIG. 1 has an induction furnace jacket 1 including a refractory lining 2 surrounded and supported by an induction coil 3. The refractory lining 2 contains a bath of a metal melt that is molten in the induction furnace. Furthermore, the induction coil 3 is supported by several magnetic yokes 7, which are supported by insulation pads 8 that are held under compression by yoke bolts 9. The function of the magnetic yokes is to confine the magnetic field produced by the induction coil 3 and to prevent it from overheating the furnace jacket and also to mechanically support the induction coil 3.

The insulating pads 8 are placed between the yokes and their jacking bolts to enable a ground fault that is external to the furnace coil to be located to a specific yoke.

The induction furnace has a ground-fault detector 4 that is connected to the induction coil 3. This apparatus includes a signal source and a comparator measuring the resistance to ground of the induction coil and its power supply circuit (not shown in FIG. 1). The ground-fault detector 4 has a window comparator with an adjustable upper and lower limit that compares the measured resistance against upper and lower thresholds. If the measured resistance drops below the lower limit the ground detector provides an alarm that shuts the power down and signals the operator that there is a ground fault. If the measured resistance increases above the upper limit the ground detector provides an alarm that shuts the power down and signals to the operator that the ground resistance measurement circuit is defective.

Such a ground fault can be caused by a connection between coil and ground, between the power supply and ground or between other electrically live components located outside the coil and ground. A ground fault to the induction furnace coil or power supply or other electrically live components located outside the coil can belong to this. Furthermore, a coil ground fault can be caused by penetration of the molten metal through the refractory lining. In this case a path to ground is provided by the bath ground electrodes.

A problem with known kinds of ground-fault detectors of induction furnaces consists in that there is no automatic possibility to determine whether the bath ground electrodes are intact and/or provide a good electrical contact to the melt bath. The intactness of this connection is a necessary precondition for the ground fault detection apparatus 4 to determine that the metal melt has penetrated through the refractory lining 2 and has come into contact with the induction coil 3. The ability to detect such penetration is critical for the safe operation of an induction furnace.

Now, according to invention a method and an apparatus are provided that automatically examine whether the bath ground electrodes are intact and/or whether the electrically conductive connection between the metal melt bath 6 and the bath ground electrodes 5 is maintained. This is achieved by an additional insulated electrode 11 that extends through the furnace bottom. A low DC or AC current of a low-voltage source 13 is passed through this electrode 11 through the melt bath into the remaining electrodes 5 to ground. The magnitude of this current is measured and is compared with a reference value 14 in order to assure that the current remains above a preset minimum value. If the magnitude of this current drops below the reference value an alarm signal 15 is generated in order to switch off the power supply to the furnace and to signal a warning to the operator of the furnace that the ground of the furnace melt bath is defective. This ensures that the ground fault measuring means of the induction furnace has the ability to provide a ground fault alarm in the case of a penetration of the metal melt through the refractory lining of the induction furnace.

Moreover, with the known kind of ground fault monitoring the problem exists that, if a ground fault occurs, the furnace is automatically switched off and the reason has to be manually searched. Also this problem is solved by the invention. If a ground fault exists further after the furnace has been switched off the switch off signal of the ground fault detecting apparatus 4 is checked once again. For this, in the circuit of the inventive apparatus a switching device in the ground connection of the bath ground electrode 10 is provided that is opened when the ground fault exists further. If then the ground fault is no more indicated a defect exists in the refractory lining. If, however, the ground fault does not go away the fault is external with respect to the refractory lining or is caused by other reasons.

Furthermore, according to the invention a method and an apparatus are provided according to which it can be automatically determined whether a ground fault that is external of the furnace is caused by one or more magnetic yokes, and with which can be determined which specific yoke causes the fault. For this, corresponding yoke isolation switching devices 12 are provided.

Figure 2:
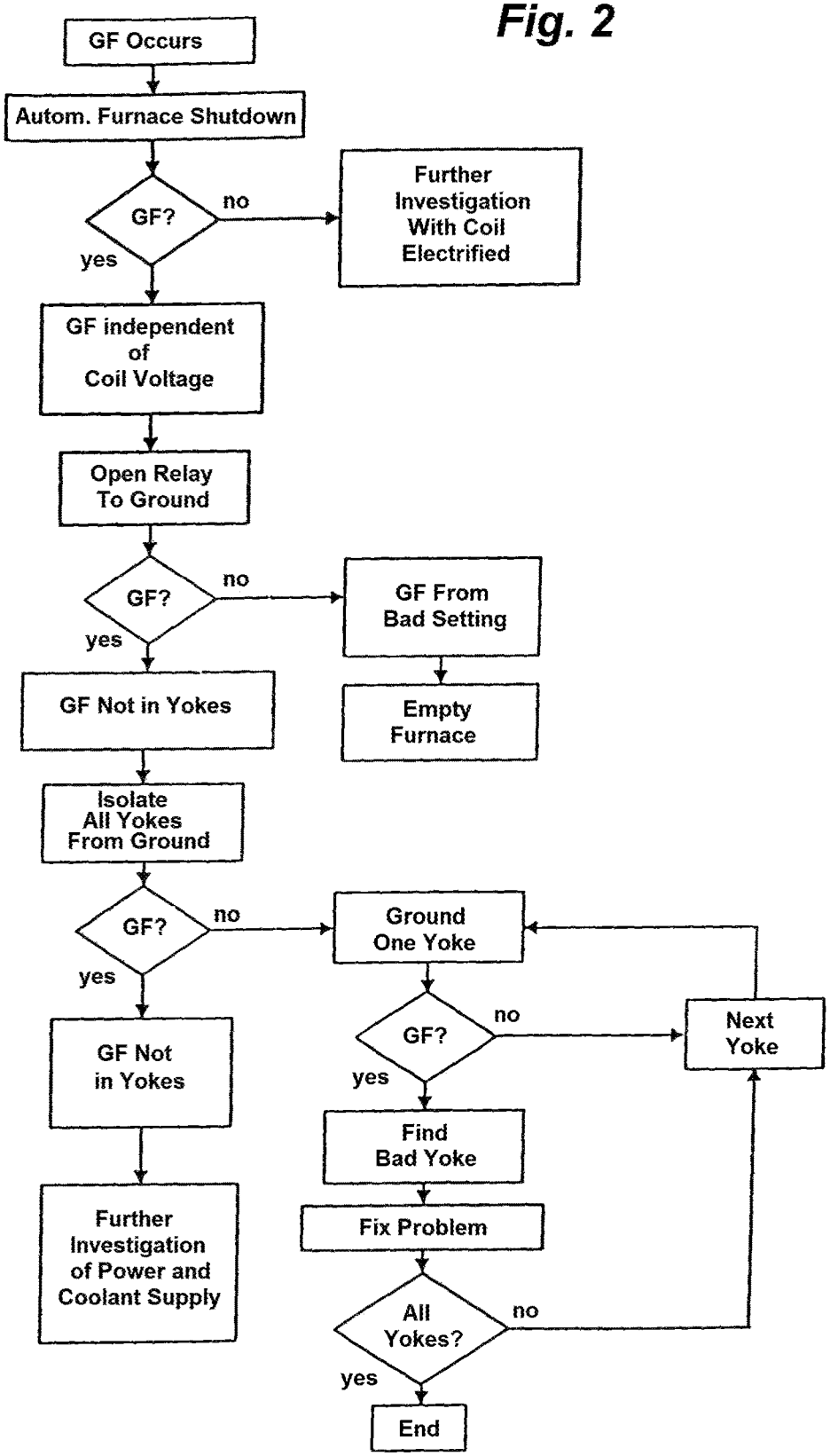
FIG. 2 shows a flow chart for the localization of a ground fault.

The sequence of the method for localizing a ground fault is shown in the flow chart of FIG. 2. When the induction furnace is operating normally there are no ground faults and no alarms. The switching device 10 and the yoke switching devices 12 are closed. However, when a ground fault does occur the system produces a ground fault alarm signal that shuts off the power to the furnace. The control system then automatically opens the switching device 10. If the ground fault goes away then the system displays the fault "lining failure." If the ground fault does not go away then the system turns on the power supply for a short time to check if there is an external ground fault that occurs only when voltage is present. If the ground fault recurs the system displays the fault "external ground" and then opens all of the yoke isolation devices 12 together. If the fault goes away the system displays the fault "yoke insulation fault." The system then closes all of the switching devices 12 and sequentially opens the yoke isolation devices 12 automatically. Normally, there is a plurality of yokes and the quantity of the yoke isolation switching devices corresponds to the number of yokes. Each time a yoke isolation switching device is opened the system checks to see if the ground fault has gone away. If that occurs then the system displays a fault message "yoke number insulation fault" where number is the yoke identification number. This test sequence is continued until all of the yokes are individually checked.

The invention claimed is:

1. A method of operating an induction furnace that has
an induction furnace jacket with a refractory lining;
an induction coil surrounding the jacket;
a ground-fault detector with at least one bath ground electrode in the lower part of the refractory lining that extends through the furnace bottom, the method comprising steps of:
loading a charge of metal into the jacket and electrically energizing the coil to melt the charge in the jacket into a bath melt electrically contacting the ground electrode;
applying a low DC or AC current to an additional insulated electrode extending through the furnace bottom and in connection with the bath melt after melting of the charge, the current flowing from this electrode through the bath melt to the at least one bath ground electrode to ground,
after melting of the charge, measuring this current and comparing the measured current with a reference value, and
generating an alarm signal indicating a defect of the bath ground electrode and deenergizing the coil when the magnitude of the current drops below the reference value.

2. The method according to claim 1, further comprising the step of:
ascertaining with the ground-fault detector whether a ground fault is caused by failure of the refractory lining or by other reasons.

3. The method according to claim 2, further comprising the steps of:
ascertaining with the ground-fault detector upon the occurrence of a ground fault whether the ground fault is caused by other reasons or by penetration of the metal melt through the refractory lining to the induction coil.

4. The method according to claim 2, further comprising the step, if a ground fault by other reasons is detected, of:
determining whether the ground fault is caused by a defective magnetic yoke insulation.

5. The method according to claim 4, further comprising the step of:
ascertaining which magnetic yoke of the induction furnace has caused a ground fault.

6. An induction furnace treating a charge of metal, the furnace comprising:
an induction furnace jacket with a refractory lining;
an induction coil surrounding the jacket and electrically energizable to melt a charge of metal in the lining into a bath melt;
a ground-fault detector with at least one bath ground electrode in the lower part of the refractory lining that extends through the furnace bottom and electrically contacts the bath melt,
an additional insulated electrode extending through the furnace bottom and also electrically contacting the bath melt,
a low-voltage source for applying a low DC or AC current to the additional electrode,
means for measuring the magnitude this current relative to ground,
means for comparing the measured magnitude of this current with a reference value, and
means for generating an alarm signal and deenergizing the coil if the current drops below the reference value.

7. The apparatus according to claim 6, further comprising:
a switching device for isolating the at least one bath ground electrode from ground.

8. The apparatus according to claim 6, further comprising:
a yoke isolation switching device.

9. An induction furnace comprising
an induction furnace jacket with a refractory lining designed for holding a bath melt,
an induction coil surrounding and supporting the refractory lining and formed for inductively heating the bath melt when a current is applied,
a ground-fault detector for detecting a ground fault in the induction furnace including at least one bath ground electrode in the lower part of the refractory lining that extends through the furnace bottom and is in electrical connection with the bath melt, and
an apparatus for automatically detecting the intactness of at least one bath ground electrode including
an additional insulated electrode extending through the furnace bottom,
a low-voltage source for applying a low DC or AC current to the additional insulated electrode that flows from the additional insulated electrode through the melt bath to the at least one ground electrode to ground,
a comparator for measuring the current and for comparing the magnitude of the current with a reference value, and
means for generating an alarm signal and deenergizing the coil when the current drops below the reference value.

* * * * *